United States Patent [19]

Weissmantel et al.

[11] Patent Number: 4,731,302

[45] Date of Patent: Mar. 15, 1988

[54] HARD COATINGS FOR MECHANICALLY AND CORROSIVELY STRESSED ELEMENTS

[75] Inventors: Christian Weissmantel; Bernd Rau; Klaus Bewilogua, all of Karl-Marx-Stadt; Dietmar Roth, Wuestenbrand; Bernd Rother, Karl-Marx-Stadt, all of German Democratic Rep.

[73] Assignee: Technische Hochschule Karl-Marx-Stadt, German Democratic Rep.

[21] Appl. No.: 915,848

[22] Filed: Oct. 6, 1986

[30] Foreign Application Priority Data

Dec. 17, 1985 [DD] German Democratic Rep. .................................... 2844075

[51] Int. Cl.$^4$ .......................... B32B 7/02; B32B 15/18
[52] U.S. Cl. ................................... 428/698; 428/699; 428/446; 428/472
[58] Field of Search ............... 428/698, 699, 446, 472; 427/47

[56] References Cited

U.S. PATENT DOCUMENTS

| | | | |
|---|---|---|---|
| 4,522,844 | 6/1985 | Khanna et al. | 427/47 X |
| 4,594,294 | 6/1986 | Eichen et al. | 428/698 X |
| 4,643,951 | 2/1987 | Keem et al. | 428/698 X |
| 4,645,715 | 2/1987 | Ovshinsky et al. | 428/698 X |

Primary Examiner—Nancy A. B. Swisher
Attorney, Agent, or Firm—Jordan and Hamburg

[57] ABSTRACT

Hard coatings for mechanically and corrosively stressed elements are applicable to arbitrarily chosen substrate materials. The mentioned elements can be tools, cutting inserts or bearings. Further, applications are possible in electronics and optics and also for decorative purposes. Hard coatings on the basis of carbon and boron nitride, produced by known techniques, are obtained which can be used in a wide field of application, exhibiting, besides a high hardness, maximum adhesion and good protection against wear and corrosion at high temperatures. The C and B/N coatings consist of amorphous network structures with short range orders similar to that of the hexagonal crystalline phases of carbon and boron nitride, have hydrogen concentrations between 5 atom-% and 50 atom-% and additional components consisting of metals and/or boron and or silicon and/or noble gases in the concentration range between 1 atom-% and 85 atom-%.

16 Claims, No Drawings

HARD COATINGS FOR MECHANICALLY AND CORROSIVELY STRESSED ELEMENTS

BACKGROUND OF THE INVENTION

The invention relates to coatings with strong adhesion on arbitrarily chosen substrate materials, high hardness and high wear and corrosion resistance. These films increase the service life and improve the functional properties of the coated elements. Such elements are for example, tools, cutting inserts, bearings, or corrosive stressed elements.

Further applications can be expected in the fields of electronics and optics and also for decorative purposes. Hard coatings for mechanical and corrosive stressed elements in many cases are deposited by ion-assisted techniques. Different types of such deposition techniques are known. It depends on the special technical or scientific problem to be solved, which method is the most effective one.

In patent DD-WP No. 155826, hard coatings consisting of diamondlike carbon, metal components and carbides, nitrides, or borides are described. For the synthesis of carbides etc., high energies of generation or high temperatures are necessary. Commonly, for ion-assisted techniques, similar conditions must be chosen. Therefore, thermally sensitive elements can be coated only at high technical expense, or the coating of such elements impossible. For example are higher than 300° C. and for chromium carbide phases higher than 1000° C. (K. Bewilogua et al., Kristall and Technik 15 (1980) 1205). In patent DE-OS No. 3246361, a layer with excellent sliding properties consisting of a carbonmetal matrix described. However, a film of this type, having good sliding properties, does not fulfil the requirements of corrosion and wear resistance.

Furthermore, hard coatings on the basis of boron/nitrogen (B/N) are known (DD-WP No. 156717). The adhesion of such coatings, especially on metal substrates, is in many cases insufficient and must be improved by intermediate layers. In the described range of film thicknesses (0.2 ... 2 $\mu$m), a wear-reducing effect can be obtained only for small values of the normal load during the wear process.

All the described hard coatings exhibit high efficiency only in special fields of application, for instance as wear- or corrosion-resistive layers.

SUMMARY OF THE INVENTION

It is an aim of the invention to obtain hard coatings produced by known technologies, which can be used in a wide field of application, having mechanical and/or corrosion-reducing functions and which can be deposited on arbitrarily chosen substrate materials (without an external substrate heating during the deposition process).

It is another object of the invention to produce hard coatings on the basis of carbon (C) and boron/nitrogen (B/N), which exhibit, besides high hardness, maximum adhesion and also good corrosion, wear and temperature stabililty.

According to the invention, this problem solved by i-carbon (i-C) or i-boron/nitrogen (i-B/N) coatings consisting of amorphous networks with short range orders similar to those of hexagonal crystalline phases, containing hydrogen with concentrations between 5 atom-% and 50 atom-% and also components consisting of metal and/or boron and /or silicon and /or nobel gases in the concentration range from 1 atom-% to 85 atom-%.

DETAILED DESCRIPTION OF THE PREFERRED EMBODIMENTS

It was shown that especially the atomic short range order, similar to that in the hexagonal crystalline phase, in connection with hydrogen, causes mechanical properties which cannot be reached with other known structures or compositions, respectively. By incorporating the components mentioned above, the properties of the coatings can be improved and fitted to the special field of application.

These hard coatings can be deposited onto arbitrarily chosen substrate materials like hard metal, high-speed steel, aluminum, silicon, copper, brass and bronze, zinc, ceramics or rock salt. To ensure the adhesion of the hard coatings, especially on copper, brass and bronze, an intermediate layer of TiN or Al can be used. Preferably, the hard coatings will be deposited by ion-assisted deposition techniques, working with ion energies of 50 ... 10000 eV. The incorporated components exist in the films as molecules and/or clusters. The film thicknesses range from 0.01 $\mu$m to 20 $\mu$m.

The concentrations of the constituents of the coatings can be changed, continuously or discontinuously, perpendicular to the substrate surface.

The hardness of the described hard coatings (to be chosen between 10 GPa and 60 GPa) is connected with their structure, with the substrate material and with the application purpose.

For coatings on the basis of i-C, the fit will essentially be realised by changes of the strength of the cross-linkages in the amorphous network-structure. The incorporated hydrogen saturates free bonds in teh amorphous carbon network and stabilizes this structure. In a similar way, the inclusions in the boron-nitrogen network cause reductions of the internal stresses in the i-B/N films and therefore a stronger adhesion on the substrate is reached. Components of these i-B/N coatings which consist of metals, metal nitrides and/or metal carbides are also known as catalyzers for the generation of cubic boron nitride.

EXAMPLES

In greater detail the invention will be explained by three examples In the first example, the hard coating was deposited on a hard metal substrate (Vickers hardness of the substrate material $VH_{0.04}$ 16 GPa, load L=0.04 N). The deposition was carried out by an ion-assisted technique onto a cooled substrate, working with the ion energy of 1000 eV and benzene as a carbon-containing substance. The hard coating with a thickness of 5 $\mu$m consisted of 60 atom-% carbon, 20 atom-% chromium and 20 atom-% hydrogen.

Using chromium as the metal component, a very high corrosion resistance is obtained additionally. Chromium/carbon coatings show a great tendency to passivation and a high stability in the passive state. Depending on the chemical composition of the deposit, the corrosion behavior of Cr/C comprises the corrosion behavior of chromium and the chemical stability of i-carbon.

The adhesion energy of the coating is $2.5 \cdot 10^{-2}$ N . $cm^{-1}$ and the density is 3.0 g . $cm^{-3}$. The layer has a friction coefficient $\mu$ 0.15 and a Vickers hardness $VH_{0.04}=25$ GPa.

In the second example, a hard coating for corrosion and wear protection is deposited on a bronze substrate which was degreased before the deposition. The film has a nature described as follows: On the bronze substrate there is an aluminum film (thickness 100 nm) with high adhesion, containing about 1 atom-% krypton. This aluminum intermediate layer is followed by a region with a linear gradient of the aluminum concentration. At the end of this region, a composition of 60 atom-% carbon, 30 atom-% aluminum and 10 atom-% hydrogen thickness of 1 μm. In the thickness range between 1.0 μm and 1.2 μm the aluminum concentration decreases linearely down to 5 atom-%. Up to the total film thickness of 4 μm, the deposit consists of carbon with an amorphous network structure, containing 20 atom-% hydrogen and 5 atom-% aluminum.

This coating exhibits a hardness $VH_{0.04}$ 20 GPa and has, contrary to the pure i-carbon deposits, a high adhesion also at mechanical stresses (wear resistance tests at pressures of 1 GPa were carried out). The friction coefficient is 0.1. From corrosion tests, values of the rest potential were determined which correspond to the potentials of noble metals in the electrochemical series.

In the third example, a hard coating is deposited on a cutting-tool tip, already coated with a TiN layer.

By separate evaporation of boron and titanium in a gas mixture consisting of 60 atom-% $NH_3$ and 40 atom-% argon, working with an ion energy of 2 keV, a hard coating consisting of 85 atom-% boron, 5 atom-% titanium, 5 atom-% hydrogen and 5 atom-% nitrogen was deposited. This layer shows a high temperature stability up to 1100° C., has a Vickers hardness $VH_{0.1}=25$ GPa and a density $=2.3$ g·m$^{-3}$. Adhesion energies $^2$ $3.0 \cdot 10^{-2}$ N·cm$^{-1}$ were measured. The electrical resistivity is $10^{11}$ ·cm.

The structure and the chemical composition of the described hard coating were revealed by electron microscopy and diffraction, by analytical methods, working with electron beam excitations, and by a nuclear reaction method to determine the hydrogen content.

What we claim is:

1. A hard coating for mechanically and corrosively stressed parts, such as tools, tool inserts, bearings or corrosively stressed modules, comprising a boron nitride layer having an amorphous network structure with an atomic short-range order similar to that of hexagonal crystalline phases, bound hydrogen in an amount of from 5 atom percent to 50 atom percent for stabilizing the structure, and an additional material selected form the group consisting of metals, boron, silicon, inert gases and mixtures thereof intercalated in the structure in an amount of from 1 atom percent to 50 atom percent.

2. A hard coating as in claim 1, further comprising a substrate selected from the group consisting of hard metal, high-speed steel, aluminum, silicon, copper, brass, bronze, zinc, ceramics and rock salt.

3. A hard coating as in claim 1, deposited on a substrate and having an intermediate layer selected from the group consisting of TiN and Al.

4. A hard coating as in claim 1, deposited on a substrate by an ion-assisted technique using ion energies between 50 eV and 10,000 eV.

5. A hard coating as in claim 1, wherein the incorporated components exist in the coating as molecules and/or clusters.

6. A hard coating as in claim 1, wherein the constituents of the coating have a varying concentration through the thickness of the coating.

7. A hard coating as in claim 1, having a thickness of from 0.01 μm to 20 μm.

8. A hard coating as in claim 1, having a hardness of from 10 GPa to 60 GPa.

9. A hard coating for mechanically and corrosively stressed parts, such as tools, tool inserts, bearings or corrosively stressed modules, comprising a carbon layer having an amorphous network structure with an atomic short-range order similar to that of hexagonal crystalline phases, bound hydrogen in an amount of from 5 atom percent to 50 atom percent for stabilizing the structure, and an additional material selected from the group consisting of metals, boron, silicon, inert gases and mixtures thereof intercalated in the structure in an amount of from 1 atom percent to 50 atom percent.

10. A hard coating as in claim 9, further comprising a substrate selected from the group consisting of hard metal, high-speed steel, aluminum, silicon, copper, brass, bronze, zinc, ceramics and rock salt.

11. A hard coating as in claim 9, deposited on a substrate and having an intermediate layer selected from the group consisting of TiN and Al.

12. A hard coating as in claim 9, deposited on a substrate by an ion-assisted technique using ion energies between 50 eV and 10,000 eV.

13. A hard coating as in claim 9, wherein the incorporated components exist in the coating as molecules and/or clusters.

14. A hard coating as in claim 9, wherein the constituents of the coating have a varying concentration through the thickness of the coating.

15. A hard coating as in claim 9, having a thickness of from 0.01 μm to 20 μm.

16. A hard coating as in claim 9, having a hardness of from 10 GPa to 60 GPa.

* * * * *